(12) United States Patent
Yoo et al.

(10) Patent No.: US 10,522,786 B2
(45) Date of Patent: *Dec. 31, 2019

(54) ORGANIC ELECTRONIC DEVICE HAVING DIMENSION TOLERANCE BETWEEN ENCAPSULATING LAYER AND METAL LAYER LESS THAN OR EQUAL TO 200 MICRONS

(71) Applicant: LG CHEM, LTD., Seoul (KR)

(72) Inventors: Hyun Jee Yoo, Daejeon (KR); Seung Min Lee, Daejeon (KR); Hyun Suk Kim, Daejeon (KR); Suk Ky Chang, Daejeon (KR); Jung Ok Moon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,244

(22) Filed: Sep. 7, 2018

(65) Prior Publication Data
US 2019/0074480 A1 Mar. 7, 2019

Related U.S. Application Data

(63) Continuation of application No. 14/892,929, filed as application No. PCT/KR2014/004551 on May 21, 2014, now Pat. No. 10,103,352.

(30) Foreign Application Priority Data

May 21, 2013 (KR) .................. 10-2013-0057309

(51) Int. Cl.
*H01L 51/52* (2006.01)
*H01L 51/00* (2006.01)
*H01L 51/56* (2006.01)

(52) U.S. Cl.
CPC ........ *H01L 51/5253* (2013.01); *H01L 51/004* (2013.01); *H01L 51/0035* (2013.01);
(Continued)

(58) Field of Classification Search
None
See application file for complete search history.

(56) References Cited

U.S. PATENT DOCUMENTS

| 8,994,012 B2 | 3/2015 | Hirase |
| 2005/0062174 A1 | 3/2005 | Ingle |

(Continued)

FOREIGN PATENT DOCUMENTS

| CN | 1700823 A | 11/2005 |
| CN | 102681072 A | 9/2012 |

(Continued)

OTHER PUBLICATIONS

Fubini, et al."Reactivity Towards Water of Silicon Nitride:Energy of Interaction and Hydration Dehydration Mechanism"; Journal of Materials Science; vol. 24. Issue 2, pp. 549-556; Feb. 1989.

(Continued)

*Primary Examiner* — Michael Jung
(74) *Attorney, Agent, or Firm* — Dentons US LLP (57) ABSTRACT

Provided are an organic electronic device (OED) and a method of manufacturing the same. The OED may effectively block moisture or oxygen permeating into the OED from an external environment, provide high reliability by increasing a life span and durability of an organic electronic diode, and minimize an align error in a process of attaching a film encapsulating the organic electronic diode to a substrate.

18 Claims, 1 Drawing Sheet

(52) U.S. Cl.
CPC ...... *H01L 51/0043* (2013.01); *H01L 51/5256* (2013.01); *H01L 51/56* (2013.01); *H01L 51/5243* (2013.01); *H01L 51/5259* (2013.01); *H01L 2251/303* (2013.01); *H01L 2251/558* (2013.01)

(56) References Cited

U.S. PATENT DOCUMENTS

| | | |
|---|---|---|
| 2005/0212419 A1 | 9/2005 | Vazan et al. |
| 2011/0212304 A1 | 9/2011 | Han et al. |
| 2011/0241528 A1 | 10/2011 | Choi |
| 2011/0273077 A1 | 11/2011 | Chen et al. |
| 2012/0097982 A1 | 4/2012 | Wakimoto et al. |
| 2012/0273975 A1 | 11/2012 | Hayasita et al. |
| 2013/0082592 A1* | 4/2013 | Song ............... H01L 51/5246 313/504 |
| 2013/0126932 A1 | 5/2013 | Chen et al. |
| 2013/0214266 A1 | 8/2013 | Hirase |
| 2014/0138634 A1 | 5/2014 | Lee et al. |
| 2014/0291617 A1* | 10/2014 | Kim .................. H01L 51/56 257/40 |
| 2014/0315016 A1 | 10/2014 | Dollase et al. |
| 2015/0042346 A1 | 2/2015 | Oh et al. |
| 2015/0270313 A1 | 9/2015 | Popp et al. |
| 2015/0274885 A1 | 10/2015 | Joy et al. |
| 2015/0287940 A1 | 10/2015 | Yoo et al. |
| 2016/0046103 A1 | 2/2016 | Hong et al. |
| 2016/0181571 A1* | 6/2016 | Mo .................. H01L 51/5203 257/40 |
| 2016/0193815 A1 | 7/2016 | Mitchell et al. |

FOREIGN PATENT DOCUMENTS

| | | |
|---|---|---|
| CN | 102763211 A | 10/2012 |
| EP | 2011639 A1 | 1/2009 |
| EP | 2579353 A2 | 4/2013 |
| EP | 2637229 A2 | 9/2013 |
| GB | 2395358 A | 5/2004 |
| JP | 1997274990 A | 10/1997 |
| JP | 2004-111158 A | 4/2004 |
| JP | 2009-48834 A | 3/2009 |
| JP | 2010097803 A | 4/2010 |
| JP | 2012-109226 A | 6/2012 |
| KR | 1020080101704 A | 11/2008 |
| KR | 1020120046704 A | 5/2012 |
| KR | 1020120113472 A | 10/2012 |
| TW | 201231605 A | 8/2012 |
| TW | 201236873 A1 | 9/2012 |
| WO | 2011/027815 A1 | 3/2011 |
| WO | 2011/086500 A3 | 7/2011 |
| WO | 2011099362 A1 | 8/2011 |
| WO | 2011161586 A1 | 12/2011 |
| WO | 2012/053451 A1 | 4/2012 |
| WO | 2012/060621 A2 | 5/2012 |

OTHER PUBLICATIONS

Choi, et al."Modulus and Surface Energy-Tunable Ultraviolet-Curable Polyurethane Acrylate:Properties and Applications"; J. Mater. Chem, 2011, 21,14325-14335; 2011.

Watari, et al. "Effect of Grain Size on the Thermal Conductivity of Si3N4"; J. A,. Ceram.Soc. 82[3], 777-779; 1999.

* cited by examiner

ORGANIC ELECTRONIC DEVICE HAVING DIMENSION TOLERANCE BETWEEN ENCAPSULATING LAYER AND METAL LAYER LESS THAN OR EQUAL TO 200 MICRONS

FIELD OF THE INVENTION

This application is a Continuation of U.S. patent application Ser. No. 14/892,929 filed Nov. 20, 2015, now issued as U.S. Pat. No. 10,103,352, which is the U.S. National Phase application of International Application No. PCT/KR2014/004551 filed on May 21, 2014, which claims the benefit of Korean Patent Application No. 10-2013-0057309, filed May 21, 2013, all of which are hereby incorporated by reference in their entirety for all purposes as if fully set forth herein.

DISCUSSION OF ART

An OED is a device including an organic material layer generating exchange of charges using holes and electrons, and may be, for example, a photovoltaic device, a rectifier, a transmitter, and an organic light emitting diode (OLED).

An OLED among the OEDs consumes less power and has a higher response speed than conventional light sources, and is preferable as a thin display device or light. In addition, the OLED has excellent space utilization, and thus is expected to be applied in various fields including all kinds of portable devices, monitors, notebook computers, and TVs.

To expand commercialization and use of the OLED, the most important problem is durability. Organic materials and metal electrodes included in the OLED are very easily oxidized by external factors such as moisture. Accordingly, a product including the OLED is very sensitive to environmental factors. To solve the above-described problem, an encapsulant for an OED is applied. However, an automatic logistics process for a thin encapsulant is difficult, and failures such as align errors highly occur in a process of attaching an encapsulant to a base substrate due to a gradually-shorter bezel. Accordingly, a method of solving the problems is needed.

SUMMARY OF THE INVENTION

The present application is directed to providing an OED and a method of encapsulating an OED.

Hereinafter, with reference to the accompanying drawings, exemplary embodiments of the present application will be described in further detail. In addition, to explain the present application, detailed descriptions for known general functions or configurations will be omitted. In addition, the accompanying drawings are schematically provided to help in understanding the present application, and to more clearly explain the present application, parts that do not relate to the descriptions will be omitted, thicknesses are exaggerated to clearly express several layers and regions, and the scope of the present application is not limited by thicknesses, sizes, and ratios shown in the drawings.

One aspect of the present application provides an OED. The term "organic electronic device (OED)" used herein refers to a product or device having a structure including an organic material layer generating exchange of charges using holes and electrons between a pair of electrodes facing each other, and may be, but is not limited to, for example, a photovoltaic device, a rectifier, a transmitter, and an organic light emitting diode (OLED). In one exemplary embodiment of the present application, the OED may be an OLED.

The present application provides an OED, which includes a substrate, an organic electronic diode formed on the substrate, and an encapsulation film including an encapsulating layer including an encapsulating resin to encapsulate an entire surface of the organic electronic diode and a metal layer formed on the encapsulating layer. In one example, a dimension tolerance (d) between the metal layer and the encapsulating layer of the encapsulation film may satisfy the following Equation 1:

$$|d| \leq 200 \ \mu m \qquad \text{[Equation 1]}$$

In Equation 1, d is a difference in distance between an arbitrary side surface of the metal layer and a side surface of the encapsulating layer corresponding to the above side surface of the metal layer. As the lower limit of the dimension tolerance is smaller, align errors may be reduced. Therefore, the lower limit of the dimension tolerance may be, but is not particularly limited to, 0 μm. The dimension tolerance d may be, for example, 0 to 200 μm, 0.1 to 190 μm, 0.5 to 180 μm, 0.8 to 170 μm, 1 to 160 μm, 1 to 150 μm, 1 to 140 μm, 1.5 to 130 μm, 2 to 120 μm, 2 to 110 μm, or 2 to 100 μm. As the difference in distance between the outermost side surfaces of the metal layer and the encapsulating layer is controlled, probability of failures such as an align error of the encapsulation film undergoing a process performed at a specific temperature may be minimized.

The encapsulation film may be used to encapsulate an entire surface of the organic electronic diode, and includes a metal layer and an encapsulating layer having a monolayer or multilayer structure including an encapsulating resin. In the present application, as long as satisfying the above-described dimension tolerance d, the structures of the metal layer and the encapsulating layer and materials constituting these layers are not particularly limited.

The metal layer according to an exemplary embodiment of the present application may be transparent or opaque. A material for or a method of forming the metal layer is not particularly limited as long as it satisfies the above-described thermal expansion coefficient range. For example, the metal layer may be a thin film-type metal foil, or a layer formed by depositing a metal on a polymer base substrate. The metal layer may be any one that can have thermal conductivity and moisture barrierability. The metal layer may include any one of a metal oxide, a metal nitride, a metal carbide, a metal oxynitride, a metal oxyboride, and a mixture thereof. For example, the metal layer may include a metal oxide such as silicon oxide, aluminum oxide, titanium oxide, indium oxide, tin oxide, indium tin oxide, tantalum oxide, zirconium oxide, niobium oxide, and a mixture thereof. The metal layer may be deposited by a means for electrolysis, rolling, evaporation, electron beam evaporation, sputtering, reactive sputtering, chemical vapor deposition, plasma chemical vapor deposition, or electron cyclotron resonance source plasma chemical vapor deposition. In one exemplary embodiment of the present application, the metal layer may be deposited by reactive sputtering.

The metal layer preferably has a thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. Due to the high thermal conductivity, heat generated at a junction interface in a metal layer junction process may be more rapidly emitted. In addition, the high thermal conductivity rapidly emits heat accumulated in operation of an OED to an external atmosphere, and thus a temperature of the OED can be maintained at a lower level, and cracks and failures can be reduced.

The metal layer according to one exemplary embodiment of the present application may include a base substrate. The base substrate may be, but is not limited to, selected from polyethyleneterephthalate, polytetrafluoroethylene, polyethylene, polypropylene, polybutene, polybutadiene, a vinyl chloride copolymer, polyurethane, ethylene-vinyl acetate, an ethylene-propylene copolymer, an ethylene-ethyl acrylate copolymer, an ethylene-methyl acrylate copolymer, polyimide, nylon, and a combination thereof as a polymer resin material. The base substrate may prevent corrosion when in contact with moisture, and damage due to folding or bending during the process.

The encapsulating layer according to the present application may be formed in a single layer or at least two layers. In one example, the encapsulating layer may have a tensile modulus of 0.001 to 500 MPa at room temperature. A material for the encapsulating layer according to the present application is not particularly limited as long as it satisfies the range of the tensile modulus. The tensile modulus used herein is a tensile modulus measured at a temperature of 25° C. unless particularly defined otherwise. In addition, the tensile modulus used herein may refer to a tensile modulus of a curable component measured after curing unless particularly defined otherwise. In one example, the tensile modulus may refer to a tensile modulus measured after curing at approximately 100° C. for approximately 120 minutes, a tensile modulus measured after radiating UV rays at a radiation dose of approximately 1 J/cm$^2$ or more, or a tensile modulus measured after thermal curing is additionally performed after UV radiation.

As described above, the encapsulating layer may have a tensile modulus of 0.001 to 500 MPa at room temperature, and for example, 0.001 to 490 Mpa, 0.001 to 480 Mpa, 0.001 to 470 Mpa, 0.001 to 460 Mpa, 0.001 to 450 Mpa, 0.001 to 440 Mpa, 0.001 to 430 Mpa, 0.001 to 420 Mpa, 0.001 to 410 Mpa, 0.001 to 400 Mpa, 0.05 to 450 Mpa, 0.1 to 450 Mpa, 0.2 to 450 Mpa, 0.3 to 450 Mpa, or 0.5 to 450 Mpa. As the tensile modulus of the encapsulating layer is controlled within a specific range, a chance to have failures such as align errors of the encapsulation film undergoing a process performed at a specific temperature may be minimized.

In one example, when the encapsulating layer is formed in a multilayer structure, a component constituting each encapsulating layer may be the same as or different from each other. Here, the component constituting the encapsulating layer may be an encapsulating resin, a moisture adsorbent, a curable material, or other additives.

In one example, the encapsulating resin may be a styrene-based resin or elastomer, a polyolefin-based resin or elastomer, other elastomers, a polyoxyalkylene-based resin or elastomer, a polyester-based resin or elastomer, a polyvinylchloride-based resin or elastomer, a polycarbonate-based resin or elastomer, a polyphenylenesulfide-based resin or elastomer, a mixture of hydrocarbon, a polyamide-based resin or elastomer, an acrylate-based resin or elastomer, an epoxy-based resin or elastomer, a silicon-based resin or elastomer, a fluorine-based resin or elastomer, or a mixture thereof.

Here, the styrene-based resin or elastomer may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or a mixture thereof. The olefin-based resin or elastomer may be, for example, a high-density polyethylene-based resin or elastomer, a low-density polyethylene-based resin or elastomer, a polypropylene-based resin or elastomer, or a mixture thereof. The elastomer may be, for example, an ester-based thermoplastic elastomer, an olefin-based elastomer, a silicon-based elastomer, an acryl-based elastomer, or a mixture thereof. Among these, the olefin-based thermoplastic elastomer may be a polybutadiene resin or elastomer or a polyisobutylene resin or elastomer. The polyoxyalkylene-based resin or elastomer may be, for example, a polyoxymethylene-based resin or elastomer, a polyoxyethylene-based resin or elastomer, or a mixture thereof. The polyester-based resin or elastomer may be, for example, a polyethylene terephthalate-based resin or elastomer, a polybutylene terephthalate-based resin or elastomer, or a mixture thereof. The polyvinylchloride-based resin or elastomer may be, for example, polyvinylidene chloride. The mixture of hydrocarbon may be, for example, hexatriacotane or paraffin. The polyamide-based resin or elastomer may be, for example, nylon. The acrylate-based resin or elastomer may be, for example, polybutyl(meth)acrylate. The epoxy-based resin or elastomer may be, for example, a bisphenol-type such as a bisphenol A-type, a bisphenol F-type, a bisphenol S-type, and a hydrogenated product thereof; a novolac-type such as a phenol novolac-type or a cresol novolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as a dicyclopentadiene-type; an ester-type; an etherester-type; or a mixture thereof. The silicon-based resin or elastomer may be, for example, polydimethylsiloxane. In addition, the fluorine-based resin or elastomer may be a polytrifluoroethylene resin or elastomer, a polytetrafluoroethylene resin or elastomer, a polychlorotrifluoroethylene resin or elastomer, a polyhexafluoropropylene resin or elastomer, polyvinylidene fluoride, polyvinyl fluoride, polyethylenepropylene fluoride, or a mixture thereof.

The listed resin or elastomer may be grafted with maleic anhydride, copolymerized with a monomer to prepare another listed resin or elastomer, or a resin or an elastomer, or modified by another compound. The compound may be a carboxyl-terminated butadiene-acrylonitrile copolymer.

In one exemplary embodiment, as the encapsulating resin, a copolymer of an olefin-based compound including a carbon-carbon double bond may be included, but the present application is not limited thereto.

In addition, the encapsulating resin may be a copolymer of a diene and an olefin-based compound including a carbon-carbon double bond. Here, the olefin-based compound may include isobutylene, propylene, or ethylene, the diene may be a monomer that can be polymerized with the olefin-based compound, and may include, for example, 1-butene, 2-butene, isoprene, or butadiene. That is, the encapsulating resin of the present application may be, for example, a homopolymer of an isobutylene monomer; a copolymer prepared by copolymerizing a monomer that can be polymerized with an isobutylene monomer; or a mixture thereof. In one example, a copolymer of an olefin-based compound including a carbon-carbon double bond and a diene may be butyl rubber.

The encapsulating resin may have a weight average molecular weight (Mw) as can be molded in the form of a film. For example, the resin may have a weight average molecular weight (Mw) of approximately 100,000 to 2,000,000, 100,000 to 1,500,000, or 100,000 to 1,000,000. The term "weight average molecular weight" refers to a conversion value for standard polystyrene measured by gel permeation chromatography (GPC). However, the resin or elastomer component may not have the above-described weight average molecular weight. For example, when the molecular weight of the resin or elastomer component is not in a sufficient level to form a film, a separate binder resin may be added to a component constituting an encapsulating layer.

In yet another embodiment, the encapsulating resin may include a curable resin. In one example, components constituting the above-described encapsulating layer is not particularly limited as long as the encapsulating layer satisfies the tensile modulus or glass transition temperature, and may be, for example, a curable resin. In one example, the curable resin may include a component constituting a second layer of the encapsulating layer, which will be described below.

A specific kind of the curable resin that can be used in the present application is not particularly limited, and for example, various heat-curable or photocurable resins known in the art may be used. The "heat-curable resin" used herein refers to a resin that can be cured by suitable heat application or aging, and the term "photocurable resin" refers to a resin that can be cured by radiation of electromagnetic waves. In addition, here, in the category of the electromagnetic waves, microwaves, IR rays, UV rays, X rays, γ rays. and particle beams such as α-particle beams, proton beams, neutron beams, and electron beams. In the present application, as an example of the photocurable resin, a cationic photocurable resin may be used. The cationic photocurable resin refers to a resin that can be cured by cationic polymerization or a cationic curing reaction induced by radiation of electromagnetic waves. In addition, the curable resin may be a dual curable resin having both heat-curing and photocuring characteristics.

A specific kind of a curable resin that can be used in exemplary embodiments of the present application is not particularly limited, as long as the curable resin has the above-described characteristics. For example, a resin that can be cured to exhibit adhesive characteristics may include a resin including at least one heat-curable functional group selected from a glycidyl group, an isocyanate group, a hydroxyl group, a carboxyl group or an amide group, or at least one functional group capable of being cured by the radiation of an electromagnetic wave, selected from an epoxide group, a cyclic ether group, a sulfide group, an acetal group, or a lactone group. In addition, a specific kind of the resin may include an acryl resin, a polyester resin, an isocyanate resin, or an epoxy resin, but the present application is not limited thereto.

As the curable resin in the present application, an aromatic or aliphatic, or a linear or branched epoxy resin may be used. In one exemplary embodiment of the present application, as an epoxy resin containing at least two functional groups, an epoxy resin equivalent of 180 to 1,000 g/eq may be used. When the epoxy resin having the above epoxy equivalent is used, characteristics such as adhesive performance and a glass transition temperature of the cured product may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a 4-functional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin, and a dicyclopentadiene-modified phenol-type epoxy resin.

In the present application, preferably, an epoxy resin having a cyclic structure in a molecular structure may be used, and more preferably, an epoxy resin including an aromatic group (for example, a phenyl group) may be used. When the epoxy resin includes an aromatic group, a cured product may have excellent thermal and chemical stabilities and a low absorbance, thereby enhancing reliability of an encapsulation structure of the OED. A specific example of the epoxy resin containing an aromatic group that can be used in the present application may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin, and an alkyl-modified triphenolmethane epoxy resin.

In the present application, for example, the epoxy resin is a silane-modified epoxy resin, and for example, a silane-modified epoxy resin having an aromatic group. Likewise, when an epoxy resin modified with a silane to structurally have a silane group is used, an adhesive property of the OED to a glass substrate or a substrate inorganic material is maximized, and a moisture barrierability or durability and reliability may be enhanced. Such a specific kind of the epoxy resin that can be used in the present application is not particularly limited, and the resin may be easily obtained from a manufacturer, for example, Kukdo Chemical, Co., Ltd.

As described above, the encapsulating layer may include a single layer or a multiple layer having at least two layers. When the encapsulating layer is formed in a single layer, a tensile modulus of the encapsulating layer is as described above. In addition, when the encapsulating layer is formed of at least two layers, at least one layer may have a tensile modulus of 0.001 to 500 MPa at room temperature. In addition, when the encapsulating layer includes at least two layers, the encapsulating layer may include a first layer having a tensile modulus of 0.001 to 500 MPa at room temperature, and a second layer having a tensile modulus of 500 to 1000 MPa at room temperature. When an organic electronic diode is encapsulated with at least two layers, a stacked sequence is not particularly limited, but a layer including or not including a small amount of a moisture adsorbent that will be described below may be in contact with the organic electronic diode.

In an exemplary embodiment of the present application, the encapsulating layer may further include a moisture adsorbent. The term "moisture adsorbent" may refers to any component that can absorb or remove moisture or vapor permeating from an external environment through a physical or chemical reaction. That is, the moisture adsorbent means a moisture reactive or physical adsorbent, or a mixture thereof.

The moisture reactive adsorbent chemically reacts with vapor, moisture, or oxygen permeating into the encapsulating layer to absorb moisture or vapor. The physical adsorbent may extend a path of moisture or vapor permeating into the encapsulation structure to prevent the permeation, and maximize barrierability to moisture and vapor through a matrix structure of the encapsulating resin and an interaction with the moisture reactive adsorbent.

A specific kind of the moisture adsorbent that can be used in the present application may be, but is not particularly limited to, one or a mixture of at least two of metal powder such as alumina, a metal oxide, a metal salt, or phosphorus pentoxide ($P_2O_5$) in the case of the moisture reactive adsorbent, and silica, zeolite, titania, zirconia, or montmorillonite in the case of the physical adsorbent.

Here, specifically, the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

In the present application, the moisture adsorbent such as the metal oxide may be suitably processed, and added to the composition. For example, depending on the kind of the OED to which the encapsulation film is applied, the encapsulating layer may be a thin film having a thickness of 30 μm or less, and in this case, a grinding process of the moisture adsorbent may be needed. To grind the moisture adsorbent, three-roll milling, bead milling, or ball milling may be used. In addition, when the encapsulation film of the present application is used in a top-emissive OED, a permeability of the encapsulating layer is very important, and thus the moisture adsorbent should have a small size. Accordingly, for such a use, the grinding process may also be needed.

The encapsulating layer of the present application may include a moisture adsorbent at 1 to 100 parts by weight, and preferably 5 to 50 parts by weight relative to 100 parts by weight of the encapsulating resin. As the content of the moisture adsorbent is controlled to 5 parts by weight or more, the encapsulating layer may exhibit excellent moisture and vapor preventabilities. In addition, as the content of the moisture adsorbent is controlled to 50 parts by weight or less, the encapsulating layer may be formed in a thin film having an encapsulation structure, and exhibit excellent moisture barrierability. However, the content range may be suitably controlled according to a location of the encapsulating layer without particular limitation. For example, the moisture adsorbent in a region of the encapsulating layer, which is close to the OED may be included in a smaller amount, and may be included at 0 to 20% based on a total amount of the moisture adsorbent. When the content is more than 20%, the moisture adsorbent may induce a physical damage by pressing the OED along with impurities, and induce a chemical damage to a negative electrode or an inorganic protective layer due to an excessive amount of ionic materials released after the reaction with moisture.

In the specification, unless particularly defined otherwise, the unit "parts by weight" means a weight ratio between components.

In an exemplary embodiment of the present application, the encapsulating layer may further include a tackifier according to the kind of the encapsulating resin. For example, the encapsulating layer may further include a tackifier, in addition to the above-described encapsulating resin. The tackifier may be, for example, a hydrogenated petroleum resin obtained by hydrogenating a petroleum resin. The hydrogenated petroleum resin may be partially or completely hydrogenated, and may be a mixture of such resins. Such a tackifier may have high compatibility with a component constituting the encapsulating layer and an excellent moisture barrierability. The specific hydrogenated petroleum resin may be a hydrogenated terpene-based resin, a hydrogenated ester-based resin, or a hydrogenated dicyclopentadiene-based resin. The tackifier may have a weight average molecular weight of approximately 200 to 5,000. A content of the tackifier may be suitably controlled as needed. For example, the tackifier may be included in a first layer at 5 to 100 parts by weight relative to 100 parts by weight of the encapsulating resin.

The encapsulating layer may include various additives according to a use of the film and a process of manufacturing a film, in addition to the above-described components. For example, in consideration of durability and processability, a curable material may be further included in the encapsulating layer. Here, the curable material may mean a material having a heat-curable functional group and/or an active energy ray curable functional group separately included in addition to the components constituting the encapsulating layer. In addition, a content of the curable material included in the encapsulating layer may be controlled according to a desired physical property of the film.

In an exemplary embodiment of the present application, the encapsulating layer may further include a curing agent according to the kind of the encapsulating resin. For example, through a reaction with the above-described encapsulating resin, a curing agent that may form a crosslinking structure or an initiator that may initiate a curing reaction of the resin may further be included.

A suitable kind of the curing agent may be selected and used depending on the kind of the encapsulating resin or a functional group included in the resin.

In one example, when the encapsulating resin is an epoxy resin, as the curing agent, a curing agent of an epoxy resin known in the art, for example, at least one or two of an amine curing agent, an imidazole curing agent, a phenol curing agent, a phosphorus curing agent, and an acid anhydride curing agent may be used, but the present application is not limited.

In one example, as the curing agent, an imidazole compound which is a solid at room temperature and has a melting point or degradation temperature of 80° C. or more may be used. The compound may be, but is not limited to, for example, 2-methyl imidazole, 2-heptadecyl imidazole, 2-phenyl imidazole, 2-phenyl-4-methyl imidazole, or 1-cyanoethyl-2-phenyl imidazole.

A content of the curing agent may be selected according to, for example, a kind or ratio of the encapsulating resin. For example, the curing agent may be included at 1 to 20 parts by weight, 1 to 10 parts by weight, or 1 to 5 parts by weight relative to 100 parts by weight of the encapsulating resin. However, the weight ratio may be changed according to a kind and ratio of the encapsulating resin or a functional group thereof, or a crosslinking density to be realized.

When the encapsulating resin is a resin that may be cured by radiation of active energy rays, as an initiator, for example, a cationic photopolymerization initiator may be used.

As the cationic photopolymerization initiator, an onium salt- or organometallic salt-series ionized cationic initiator, or an organic silane- or latent sulfonic acid-series ionized cationic photopolymerization initiator, or non-ionized cationic photopolymerization initiator may be used. The onium salt-series initiator may be a diaryliodonium salt, a triarylsulfonium salt, or an aryldiazonium salt, the organometallic salt-series initiator may be iron arene, the organic silane-series initiator may be o-nitrobenzyl triaryl silyl ether, triaryl silyl peroxide, or acyl silane, and the latent sulfonic acid-series initiator may be α-sulfonyloxy ketone or α-hydroxymethylbenzoin sulfonate, but the present application is not limited thereto.

In one example, as the cationic initiator, an ionized cationic photopolymerization initiator may be used.

In addition, when the encapsulating resin is a resin that may be cured by radiation of active energy rays, as the initiator, for example, a radical initiator may be used.

The radical initiator may be a photoinitiator or a thermal initiator. A specific kind of the photoinitiator may be suitably selected in consideration of a curing speed and yellowing probability. For example, the photoinitiator may be a benzoin-, hydroxy ketone-, amino ketone-, or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxy cyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylamino benzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide.

A content of the initiator, like the curing agent, may be changed according to the kind and ratio of the encapsulating resin or a functional group of the resin, or a crosslinking density to be realized. For example, the initiator may be included at 0.01 to 10 parts by weight or 0.1 to 3 parts by weight relative to 100 parts by weight of the encapsulating resin. When the content of the initiator is too small, curing may not sufficiently occur, and when the content of the initiator is too large, a content of an ionic material is increased after curing to deteriorate durability of an adhesive, or due to the characteristic of the initiator, a conjugate acid is formed, which is disadvantageous in terms of optical durability, and corrosion may occur according to a base substrate, thereby selecting a suitable content range in consideration of such a problem.

The encapsulating layer may include various materials according to a use of the film and a process of manufacturing a film. For example, when the encapsulating layer is molded in a film or sheet type, in consideration of moldability, a binder resin may be included in the encapsulating layer.

In one exemplary embodiment of the present application, the encapsulating layer may include a filler, and preferably, an inorganic filler. The filler may extend a path of moisture or vapor permeating into the encapsulation structure to prevent the permeation, and maximize barrierability to moisture and vapor through an interaction with the encapsulating resin and the moisture adsorbent. A specific kind of the filler that can be used in the present application may be, but is not particularly limited to, for example, one or a mixture of at least two of clay, talc, and needle-like silica.

In the present application, to increase a binding efficiency between a filler and an organic binder, as the filler, a product which is surface-treated with an organic material may be used, or a coupling agent may be further added.

The encapsulating layer of the present application may include a filler at 1 to 50 parts by weight, and preferably 1 to 20 parts by weight, relative to 100 parts by weight of the encapsulating resin. As the content of the filler is controlled to 1 part by weight or more, a cured product having an excellent moisture or vapor blocking property and excellent mechanical properties may be provided. In addition, in the present application, as the content of the filler is controlled to 50 parts by weight or less, a film-type encapsulating layer can be manufactured, and although the encapsulating layer is formed in a thin film, an encapsulation structure exhibiting an excellent moisture blocking characteristic may be provided.

In the present application, the organic electronic diode may be an OLED.

The OED may further include a protective film between the encapsulation film and the organic electronic diode to protect the organic electronic diode.

Figure 1:
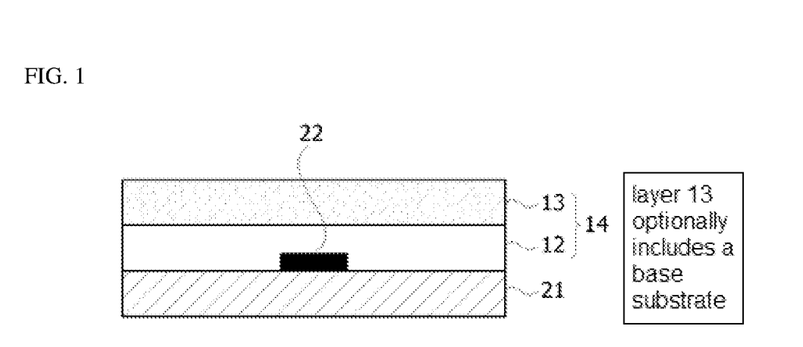
FIGS. 1 to 2 are cross-sectional views of an OED according to an exemplary embodiment of the present application.
Figure 2:
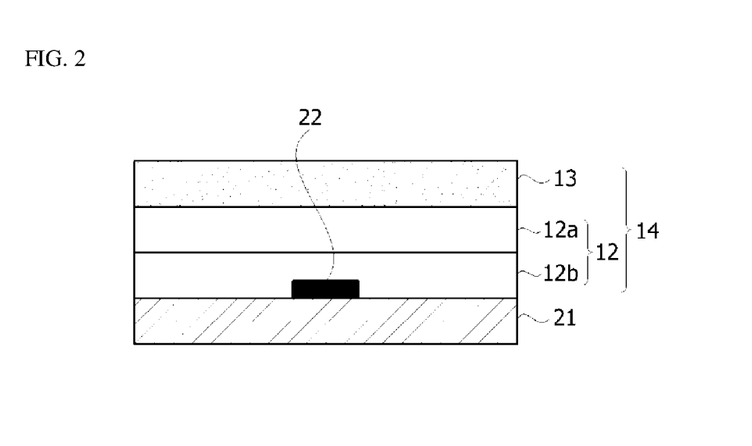

In one example, as shown in FIG. 1, the OED may be disposed such that an encapsulating layer 12 of an encapsulation film 14 is in contact with an organic electronic diode 22 and a substrate 21. In addition, a metal layer 13 may be disposed on the encapsulating layer 12. In addition, in FIG. 2, the encapsulating layer 12 may include a first layer 12a and a second layer 12b.

Yet another aspect of the present application provides a method of manufacturing an OED, which includes applying an encapsulation film including an encapsulating layer including an encapsulating resin and a metal layer formed on the encapsulating layer to a substrate on which an organic electronic diode is formed to encapsulate an entire surface of the organic electronic diode, and curing the encapsulating layer of the encapsulation film.

A dimension tolerance d between the metal layer and the encapsulating layer of the encapsulation film may satisfy Equation 1.

$$|d| \leq 200 \; \mu m \qquad \text{[Equation 1]}$$

In Equation 1, d is a difference in distance between an arbitrary side surface of the metal layer and a side surface of the encapsulating layer corresponding to the above side surface of the metal layer.

The encapsulation film may be applied to the organic electronic diode by hot roll lamination, hot pressing, or vacuum pressing of the encapsulation film, but the present application is not particularly limited thereto.

In the present application, according to the method of manufacturing an organic electronic diode, for example, a transparent electrode is formed on the substrate such as a glass or a polymer film by vacuum deposition or sputtering, and an organic material layer is formed on the transparent electrode. The organic material layer may include a hole injection layer, a hole transport layer, an emitting layer, an electron injection layer, and/or an electron transport layer. Subsequently, a second electrode is further formed on the organic material layer. Afterward, the above-described encapsulation film 14 is applied to a top surface of the organic electronic diode 22 on the substrate 21 to cover an entire surface of the organic electronic diode 22. Here, a method of applying the encapsulation film 14 may be, but is not particularly limited to, a method of applying the encapsulation film of the present application to a top surface of the organic electronic diode 22 formed on the substrate 21 through heating, pressing, or autoclaving.

In addition, an additional curing process or adhesion-enhancing process to the encapsulation film 14 to which the organic electronic diode 22 is pressed may be performed, and such a process (main curing) may be performed, for example, in a heating chamber. A curing condition in the main curing may be suitably selected in consideration of stability of the organic electronic diode 22.

However, the above-described forming process is merely an example for encapsulating the organic electronic diode 22, and thus a sequence of or condition for the process may be freely changed. In addition, after a protective layer is formed on the organic electronic diode 22, the encapsulation film may be applied and then cured.

Effects

An OED of the present application can effectively block moisture or oxygen permeating into the OED from an external environment, provide high reliability due to increases in a lifespan and durability of an organic electronic diode, and minimize an align error in a process of attaching a film to a substrate.

DETAILED DESCRIPTION OF EXEMPLARY EMBODIMENTS

Hereinafter, the present invention will be described in further detail with reference to Examples according to the present invention and Comparative Examples not according to the present invention, but the scope of the present invention is not limited to the following Examples.

Example 1

(1) Preparation of Encapsulating Layer

A moisture adsorbent solution was prepared by adding 100 g of calcined dolomite as a moisture adsorbent and toluene as a solvent to have a solid content of 50 wt %. 50 g of a polyisobutene resin (weight average molecular weight: 450,000) as an encapsulating resin of a first layer, and 50 g of a hydrogenated dicyclopentadiene-based resin (softening point: 125° C.) as a tackifier were added, and 20 g of a multifunctional acryl monomer (TMPTA) and 1 g of a photoinitiator were diluted with toluene to have a solid content of approximately 25 wt %. The moisture adsorbent solution previously prepared was mixed thereto to homogenize.

(2) Manufacture of Film

An encapsulating layer was formed to have a thickness of 40 μm by coating the previously prepared solution on a releasing surface of releasing PET and drying the coated surface at 110° C. for 10 minutes. An encapsulation film was manufactured by laminating the encapsulating layer on a Cu side of a 12 μm copper film one side of which is coated with 15 μm polyimide, and wooden-pattern punching the laminated product in a size to be tested. Here, the punching was performed on the releasing PET surface on which the encapsulating layer was formed.

(3) Manufacture of OED

The encapsulation film manufactured as described in (1) was thermally laminated in vacuum on a glass substrate on which an organic electronic diode was deposited, and aged in an oven at 100° C. for 1 hour.

Example 2

An encapsulating layer was formed to have a thickness of 40 μm by coating the solution previously prepared in Example 1 on a releasing surface of releasing PET and drying the coated surface at 110° C. for 10 minutes.

An encapsulation film was manufactured by laminating the encapsulating layer on a Cu side of a 12 μm copper film one side of which is coated with 15 μm polyimide, and wooden-pattern punching the laminated product in a size to be tested. Here, the punching was performed on a metal side. Except these, the process was performed as described in Example 1.

Comparative Example 1

An encapsulation film was manufactured by the same method as described in Example 1, except that 200 g of a silane-modified epoxy resin (KSR-177, Kukdo Chemical Co., Ltd.) and 150 g of a phenoxy resin (YP-50, Tohto Kasei Co., Ltd.) were added to a reaction vessel at room temperature, and diluted with methylethylketone (MEK), and a first layer solution was prepared by adding 4 g of imidazole (Shikoku Chemicals Co., Ltd.) as a curing agent to the homogenized solution, and stirring the resulting solution at a high speed for 1 hour.

An encapsulating layer was formed to have a thickness of 40 μm by coating the previously prepared solution on a releasing surface of releasing PET and drying the coated surface at 110° C. for 10 minutes. Each of the encapsulating layer and the copper thin film used in Example 1 was punched in a size of 5 cm×5 cm, and the encapsulating layer was thermally laminated on a cooper side of the copper thin film sample. Failures due to a tolerance generated in the lamination were evaluated.

Comparative Example 2

A moisture adsorbent solution was prepared by adding 100 g of calcined dolomite as a moisture adsorbent and toluene as a solvent to have a solid content of 50 wt %. 200 g of a silane-modified epoxy resin (KSR-177, Kukdo Chemical Co., Ltd.) and 150 g of a phenoxy resin (YP-50, Tohto Kasei Co., Ltd.) were added to a reaction vessel at room temperature, and diluted with MEK. A solution for a moisture barrier layer was prepared by adding 4 g of imidazole (Shikoku Chemicals Co., Ltd.) as a curing agent to the homogenized solution, and stirring the resulting solution at a high speed for 1 hour. A solution for a second layer was prepared by adding the previously prepared moisture adsorbent solution to the solution for a moisture barrier layer to have a content of the calcined dolomite of 50 parts by weight relative to 100 parts by weight of the encapsulating resin of the second layer. An encapsulation film was manufactured by the same method as described in Example 1, except that an encapsulating layer was formed only of the second layer.

Comparative Example 3

An encapsulation film was manufactured by the same method as described in Example 1, except that 50 g of a polyisobutene resin (weight average molecular weight: 450,000) as an encapsulating resin of an encapsulating layer and 60 g of a hydrogenated dicyclopentadiene-based resin (softening point: 125° C.) as a tackifier were added into a reaction vessel at room temperature, and diluted with toluene to have a solid content of approximately 30 wt %.

1. Measurement of Tolerance d Between Metal Layer and Encapsulating Layer

When an encapsulation film including a metal layer and an encapsulating layer was applied to an organic electronic diode, a difference in distance between the metal layer and the encapsulating layer was measured. When the metal layer was longer, it was represented as (+), and when the encapsulating layer was longer, it was represented as (−).

2. Process Failure

Throughout a process of removing a release film of an encapsulation film, and a process of laminating the encapsulation film on an organic electronic diode, when failure of removing the release film or contamination of laminating equipment due to the encapsulating layer occurred, it was represented as O.

3. High Temperature and High Humidity Reliability

A sample was manufactured by laminating the film manufactured in the Example or Comparative Example on a cover substrate, and thermal pressing the resulting substrate on a substrate in which Ca was deposited on a center 3 mm inside from the outermost glass. Afterward, the sample was maintained in a constant temperature and constant humidity chamber at 85° C. and a relative humidity of 85% for approximately 300 hours. When the sample became transparent due to oxidation of calcium, it was represented as X, and when the sample was not transparent, it was represented as O.

TABLE 1

| | Example 1 | Example 2 | Comparative Example 1 | Comparative Example 2 | Comparative Example 3 |
|---|---|---|---|---|---|
| Tolerance $|d|$ | (+)50 μm | (−)50 μm | (+)700 μm | (+)1 mm | (−)500 μm |
| Process failure | none | none | none | none | fail |
| Reliability | O | O | X | X | X |

DESCRIPTION OF REFERENCE NUMERALS

12: encapsulating layer
12a: a first layer
12b: a second layer
13: metal layer
14: encapsulation film
21: substrate
22: organic electronic device

What is claimed is:

1. An organic electronic device (OED), comprising:
   a substrate;
   an organic electronic diode formed on the substrate; and
   an encapsulation film comprising an encapsulating layer which comprises an encapsulating resin and a grinded moisture adsorbent, which encapsulates an entire surface of the organic electronic diode, and a metal-containing layer formed on the encapsulating layer, of which a dimension tolerance (d) between the metal-containing layer and the encapsulating layer of the encapsulation film satisfies Equation 1:

$$|d| \leq 200 \text{ μm} \quad \text{[Equation 1]}$$

wherein d is a difference in distance between an arbitrary side surface of the metal-containing layer and a side surface of the encapsulating layer corresponding to the arbitrary side surface of the metal-containing layer, and
   wherein the grinded moisture adsorbent is a powderized moisture adsorbent.

2. The organic electronic device according to claim 1, wherein the metal-containing layer has a thermal conductivity of 50 W/mK or more.

3. The organic electronic device according to claim 1, wherein the metal-containing layer comprises any one of a metal oxide, a metal nitride, a metal carbide, a metal oxynitride, a metal oxyboride, and a mixture thereof.

4. The organic electronic device according to claim 3, wherein the metal-containing layer comprises any one of silicon oxide, aluminum oxide, titanium oxide, indium oxide, tin oxide, indium tin oxide, tantalum oxide, zirconium oxide, niobium oxide, and a mixture thereof.

5. The organic electronic device according to claim 1, wherein the metal-containing layer further comprises a base substrate.

6. The organic electronic device according to claim 5, wherein the base substrate is any one of polyethyleneterephthalate, polytetrafluoroethylene, polyethylene, polypropylene, polybutene, polybutadiene, a vinyl chloride copolymer, polyurethane, ethylene-vinyl acetate, an ethylene-propylene copolymer, an ethylene-ethyl acrylate copolymer, an ethylene-methyl acrylate copolymer, polyimide, nylon, and a combination thereof.

7. The organic electronic device according to claim 1, wherein the encapsulating layer is a single layer or at least two layers.

8. The organic electronic device according to claim 7, wherein when the encapsulating layer is formed of at least two layers, at least one layer has a tensile modulus of 0.001 to 500 MPa at room temperature.

9. The organic electronic device according to claim 8, wherein the encapsulating layer includes a first layer having a tensile modulus of 0.001 to 500 MPa at room temperature, and a second layer having a tensile modulus of 200 to 1000 MPa at room temperature.

10. The organic electronic device according to claim 1, wherein the encapsulating layer has a tensile modulus of 0.001 to 500 MPa at room temperature.

11. The organic electronic device according to claim 1, wherein the encapsulating resin is a styrene-based resin, a polyolefin-based resin, a thermoplastic elastomer, a polyoxyalkylene-based resin, a polyester-based resin, a polyvinylchloride-based resin, a polycarbonate-based resin, a polyphenylenesulfide-based resin, a mixture of hydrocarbon, a polyamide-based resin, an acrylate-based resin, an epoxy-based resin, a silicon-based resin, a fluorine-based resin, or a mixture thereof.

12. The organic electronic device according to claim 1, wherein the encapsulating resin comprises a curable resin.

13. The organic electronic device according to claim 12, wherein the curable resin comprises at least one curable functional group selected from a glycidyl group, an isocyanate group, a hydroxy group, a carboxyl group, an amide group, an epoxide group, a cyclic ether group, a sulfide group, an acetal group, and a lactone group.

14. The organic electronic device according to claim 12, wherein the curable resin is an epoxy resin comprising a cyclic structure in a molecular structure.

15. The organic electronic device according to claim 12, wherein the curable resin is a silane-modified epoxy resin.

16. The organic electronic device according to claim 1, wherein the organic electronic diode is an organic light emitting diode.

17. A method of manufacturing an organic electronic device, comprising:

applying an encapsulation film comprising an encapsulating layer comprising an encapsulating resin and a grinded moisture adsorbent, and a metal-containing layer formed on the encapsulating layer to a substrate on which an organic electronic diode is formed to encapsulate an entire surface of the organic electronic diode; and curing the encapsulating layer of the encapsulation film, wherein a dimension tolerance (d) between the metal-containing layer and the encapsulating layer of the encapsulation film satisfies Equation 1:

$$|d| \leq 200 \ \mu m \qquad \text{[Equation 1]}$$

wherein d is a difference in distance between an arbitrary side surface of the metal-containing layer and a side surface of the encapsulating layer corresponding to the arbitrary side surface of the metal-containing layer, and wherein the grinded moisture adsorbent is a powderized moisture adsorbent.

18. The method according to claim 17, wherein the encapsulating layer of the encapsulation film covers the entire surface of the organic electronic diode.

* * * * *